(12) United States Patent
Senthilkumar et al.

(10) Patent No.: US 6,774,735 B2
(45) Date of Patent: Aug. 10, 2004

(54) LOW POWER SELF-BIASING OSCILLATOR CIRCUIT

(75) Inventors: Chinnugounder Senthilkumar, Folsom, CA (US); Tea Lee, Sacramento-Rancho Cordova, CA (US); Robert Fulton, Folsom, CA (US); Andrew M. Volk, Granite Bay, CA (US)

(73) Assignee: Intel Corporation, Santa Clara, CA (US)

( * ) Notice: Subject to any disclaimer, the term of this patent is extended or adjusted under 35 U.S.C. 154(b) by 69 days.

(21) Appl. No.: 10/053,198

(22) Filed: Jan. 17, 2002

(65) Prior Publication Data

US 2003/0132741 A1 Jul. 17, 2003

(51) Int. Cl.[7] .............................................. H03B 5/32
(52) U.S. Cl. ........................ 331/158; 331/116 FE; 331/116 R; 331/165; 331/185; 331/175; 331/186
(58) Field of Search ........................ 331/155, 158, 331/116 FE, 116 R, 165, 185, 175, 186; 710/308

(56) References Cited

U.S. PATENT DOCUMENTS

| | | | | |
|---|---|---|---|---|
| 5,848,253 A | * | 12/1998 | Walsh et al. | 395/307 |
| 6,191,662 B1 | * | 2/2001 | Volk | 331/116 FE |
| 6,278,338 B1 | * | 8/2001 | Jansson | 331/116 FE |

FOREIGN PATENT DOCUMENTS

JP         2000031740      *    1/2000

OTHER PUBLICATIONS

Vittoz et al. "CMOS Analog Integrated Circuits Based on Weak Inversion Operation" IEEE Journal of Solid-State Circuits, Jun. 1977 pp. 224–231.*
Millman "Microelectronics" McGraw-Hill Book Co 1979 pp. 237.*

* cited by examiner

Primary Examiner—Michael B Shingleton
(74) Attorney, Agent, or Firm—Fish & Richardson P.C.

(57) ABSTRACT

A clock oscillator circuit that includes an inverting amplifier and a resonator configured to generate an oscillating signal. The clock oscillator includes a bias circuit having a relatively constant current source configured to create a bias voltage to bias the amplifier in an operating state that can sustain the oscillating signal. The inverting amplifier and the bias circuit are configured to operate in a low power state.

26 Claims, 3 Drawing Sheets

LOW POWER SELF-BIASING OSCILLATOR CIRCUIT

TECHNICAL FIELD

This invention relates to low power oscillator circuits.

BACKGROUND

A computer typically has a real time clock (RTC) circuit that resides in the input/output (I/O) controller hub chip, sometimes referred to as the "south bridge." In many computers, the RTC circuit provides an accurate 32.768 KHz oscillating signal that is used to keep the system time whether the computer is on or off. The time signal generated by the RTC circuit is used as a basis to obtain the second, minute, and hour values required by the computer.

DESCRIPTION OF DRAWINGS

Like reference symbols in the various drawings indicate like elements.

DETAILED DESCRIPTION

As will be described in greater detail below, a clock circuit includes an inverting amplifier and a resonator configured to generate an oscillating signal, and a self-bias circuit configured to create a bias voltage to bias the amplifier in a low-power operating state that can sustain the oscillating signal.

Figure 1:
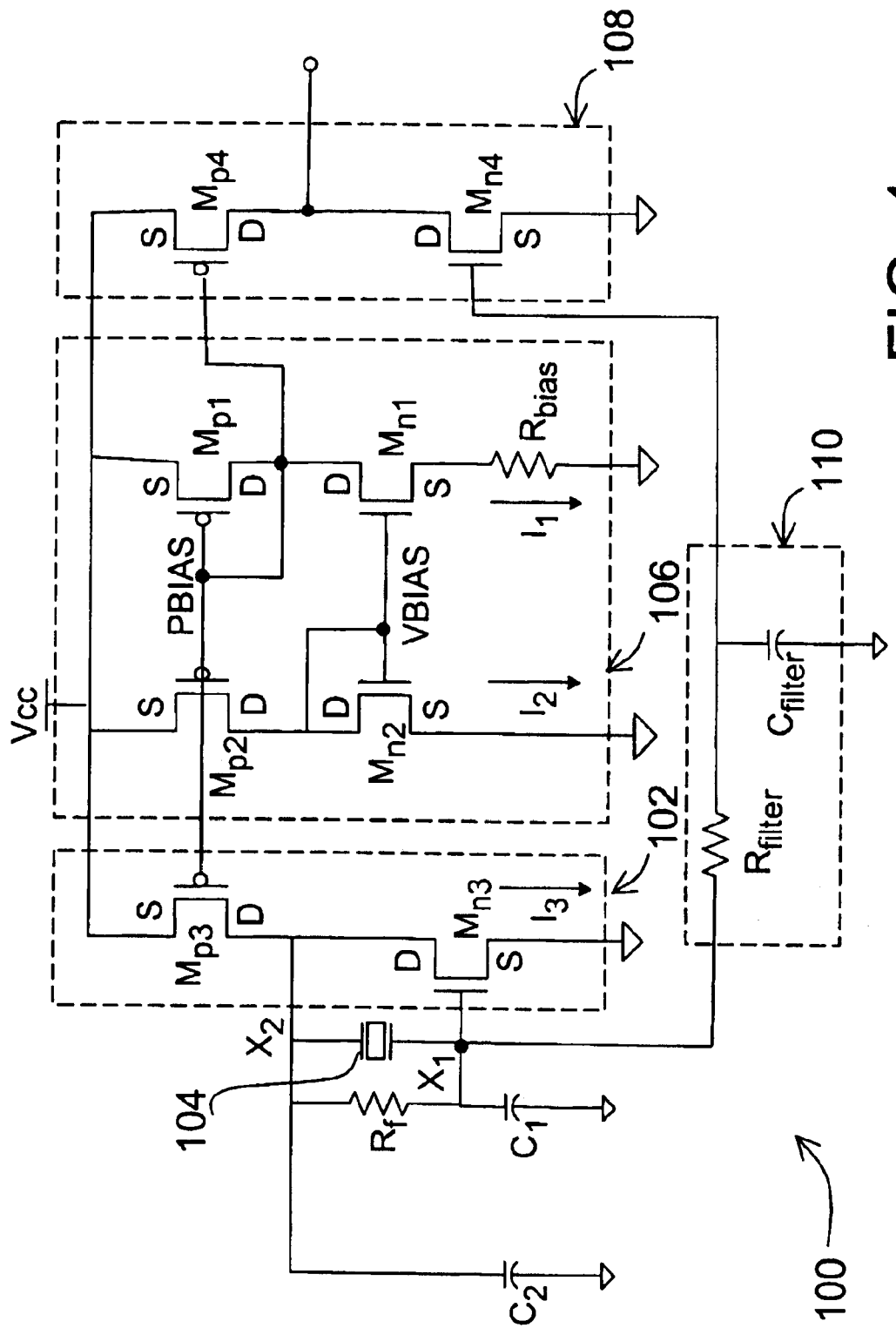
FIG. 1 is a circuit diagram of a clock oscillator circuit.

Referring to FIG. 1, a low-power clock oscillator circuit 100 includes a crystal resonator 104, an inverting amplifier 102, a self-bias circuit 106, a sine-to-square wave converter 108, and a low-pass filter 110 (all shown enclosed in dashed lines). Inverting amplifier 102 is designed to provide the necessary gain and phase shift required for oscillation. The self-bias circuit 106 generates a bias voltage at a bias node PBIAS to bias inverting amplifier 102 at a suitable DC operating point. Low-pass filter 110 filters out unwanted noise from the oscillating signal generated at one terminal of resonator 104. Converter 108 serves as an output buffer that generates a square wave having the same frequency as the oscillation frequency of resonator 104. The inverting amplifier 102, self-bias circuit 106, the converter 108, and the filter 110 are all integrated into a single integrated circuit package.

The self-bias circuit 106 has transistors $M_{n1}$, $M_{p1}$, $M_{n2}$, and $M_{p2}$ and a resistor $R_{bias}$ connected to form a constant biasing circuitry for providing a relatively constant bias current and voltage. $M_{p1}$, $M_{n1}$, and $R_{bias}$ are connected in series and form one leg of the constant biasing circuitry. $R_{bias}$ provides a negative feedback in response to a change in the amount of current $I_1$ flowing through $M_{n1}$ and $M_{p1}$. $M_{p2}$ and $M_{n2}$ are also connected in series and form another leg of the constant biasing circuitry. The gate nodes of $M_{p1}$ and $Mp_2$ are connected through node PBIAS, and the gate nodes of $M_{n1}$ and $M_{n2}$ are connected through node VBIAS. The drain and gate nodes of $M_{n2}$ are connected, and the drain and gate nodes of $M_{p1}$ are connected. This arrangement produces a relatively constant current $I_1$ flowing through $M_{p1}$ and $M_{p1}$, and a relatively constant current $I_2$ flowing through $M_{p2}$ and $M_{n2}$.

Inverting amplifier 102 includes transistors $M_{n3}$ and $M_{p3}$. The gate nodes of $M_{p1}$, $M_{p2}$, and $M_{p3}$ are connected together through node PBIAS. The sizes (i.e., the width/length ratios of the channels) of $M_{n1}$, $M_{p1}$, $M_{n2}$, $M_{p2}$, $M_{n3}$, and $M_{p3}$ and the resistance value of $R_{bias}$ are selected so that $M_{n1}$, $M_{p1}$, $M_{n2}$, $M_{p2}$, $M_{n3}$, and $M_{p3}$ all operate at a sub-threshold level while still sustaining oscillation. In the following description, a circuit is said to be in a "low power" state when the transistors in the circuit are operating in sub-threshold levels.

The current $I_1$ is determined by the relative size difference between $M_{n1}$ and $M_{n2}$, the relative size difference between $M_{p1}$ and $M_{p2}$, and resistor $R_{bias}$. In the described example, the size of $M_{p1}$ is selected to be equal to the size of $M_{n2}$ so that the magnitude of currents $I_1$ and $I_2$ are substantially the same. This allows the bias circuit to function properly while using less current than other configurations. The size ratio between $M_{p3}$ and $M_{n3}$ is similar to the size ratio between $M_{p2}$ and $M_{n2}$, except that $M_{p3}$ and $M_{n3}$ are configured to be three times greater than the size of $M_{p2}$ and $M_{n2}$, respectively. The DC voltage at the gate node of $M_{n2}$ is thus similar to the DC voltage at the gate node of $M_{n3}$, and the current $I_3$ flowing through $M_{p3}$ and $M_{n3}$ is about three times as much as $I_1$. A higher operation current is used for inverting amplifier 102 in order to provide sufficient gain so that the oscillator loop gain is always greater than one under various operating conditions. A lower operation current is used for self-bias circuit 106 in order to reduce power consumption.

Due to manufacturing tolerances, there may be mismatches between the various transistor devices. To ensure reliable performance, self-bias circuit 106 and inverting amplifier 102 are configured to have the DC gate voltage of $M_{n3}$ slightly higher than the voltage at node VBIAS. This is achieved by making transistor $M_{p3}$ slightly greater than three times that of $M_{p2}$ to account for layout geometry mismatches that may affect the loop gain.

Crystal resonator 104 has two terminals, $X_1$ and $X_2$, that are connected to input and output terminals, respectively, of inverting amplifier 102. The input terminal of inverting amplifier 102 is the gate node of $M_{n3}$, and the output terminal of inverting amplifier 102 is the drain node of $M_{n3}$. A feedback resistor $R_f$ is connected in parallel to resonator 104. The value of $R_f$ is selected so that inverting amplifier 102 achieves optimal gain for oscillation. Capacitors $C_1$ and $C_2$ are connected to terminals $X_1$ and $X_2$, respectively, to add phase shift that is necessary for oscillation. The values of these load capacitors are chosen based on the electrical characteristics of the crystal resonator 104.

In the described example, resonator 104 is selected to resonate at approximately 32.77 KHz, resistor $R_f$ is selected to have a value of about 10 Meg-Ohms, and capacitors $C_1$ and $C_2$ are selected to have capacitances of about 18 pF.

An advantage of a low-power clock oscillator having this arrangement and operated in this way is that when inverting amplifier 102 and self-bias circuit 106 are packaged in an integrated circuit (IC) package, the connection between inverting amplifier 102 and self-bias circuit 106 are contained entirely within the IC package. Because self-bias circuit 106 is not connected to any external components, self-bias circuit 106 is less likely to be influenced or affected by the environment outside of the IC package. The clock oscillator circuit 100 is thus more accurate and less likely to fail. Moreover, without the need to have additional connections to outside components, these pins can be used for other functions.

Another advantage of the invention is that the capacitance associated with node VBIAS is very small (on the order of femto Farads). Compared to previous designs that require connection of external components to provide feedback to the bias circuit, the invention allows node VBIAS to be charged faster and the DC bias voltage to be established faster, thereby allowing inverting amplifier 102 and resonator 104 to start oscillation faster. By not using any external component to generate feedback for the bias circuit, leakage current and external influences (e.g., influences from the environment or a human operator) is significantly reduced so that the clock signal is more accurate and less likely to fail at start-up.

A further advantage of the invention is that self-bias circuit 106 and inverting amplifier 102 can both operate at a low power state that consumes a very low amount of power. Transistors $M_{n1}$, $M_{p1}$, $M_{n2}$, $M_{p2}$, $M_{n3}$, and $M_{p3}$ are configured to operate at sub-threshold levels while sustaining oscillation to provide a system clock signal. This is particularly important because the RTC circuit must operate on battery power when the system power is turned off.

The circuit configuration described above can function properly across a large range of process, voltage, and temperature conditions. For example, if Vcc increases, the clock oscillator circuit 100 will still provide accurate clock signal. This is because of the size ratios of the transistor pairs (i.e., $M_{p1}:M_{n1}$, $M_{p2}:M_{n2}$; $M_{p3}:M_{n3}$) are the same, thus any influence by process, voltage, or temperature will have the same effect on the transistor pairs. Characteristics of the circuit, e.g., trip point and DC voltage levels, will change by the same amount for the inverting amplifier 102, the self-bias circuit 106, and the converter 108.

Low-pass filter 110 includes a resistor $R_{filter}$ and a capacitor $C_{filter}$. Low-pass filter 110 filters out unwanted noise from the oscillating signal generated at terminal $X_1$ of resonator 104, so that a filtered sinusoidal signal having the desired oscillating frequency is sent to converter 108. Converter 108 converts the filtered sinusoidal signal into a square wave. Converter 108 also serves as a buffer to prevent output load variations from affecting the stability of the frequency of the clock oscillator circuit 100.

Converter 108 includes transistors $M_{n4}$ and $M_{p4}$ that are configured to operate in a way similar to an inverting amplifier. The gate node of $M_{n4}$ is connected to terminal $X_1$, and the gate node of $M_{p4}$ is connected to node PBIAS. The size ratio between $M_{p4}$ and $M_{n4}$ is designed to be the same as the size ratio between $M_{p3}$ and $M_{n3}$ so that the trip point for the $M_{p4}$–$M_{n4}$ transistor pair is the same as that for the $M_{p3}$–$M_{n3}$ inverting amplifier. The trip point refers to the voltage level where the input voltage of the input amplifier equals the output voltage. The square wave generated by converter 108 has rail-to-rail voltage swings and is used to drive other logic circuits.

Self-bias circuit 106 has two stable operating states, a normal operating state and a zero current operating state. In one example, $M_{n1}$ and $M_{n2}$ are configured so that the leakage current of $M_{n1}$ is greater than $M_{n2}$. Then the bias circuit will usually remain in the normal operating state. In an alternative example, a kicker circuit (or called an excitation circuit) is used to provide an excitation to enable self-bias circuit 106 to operate at its normal operating state.

Figure 2:
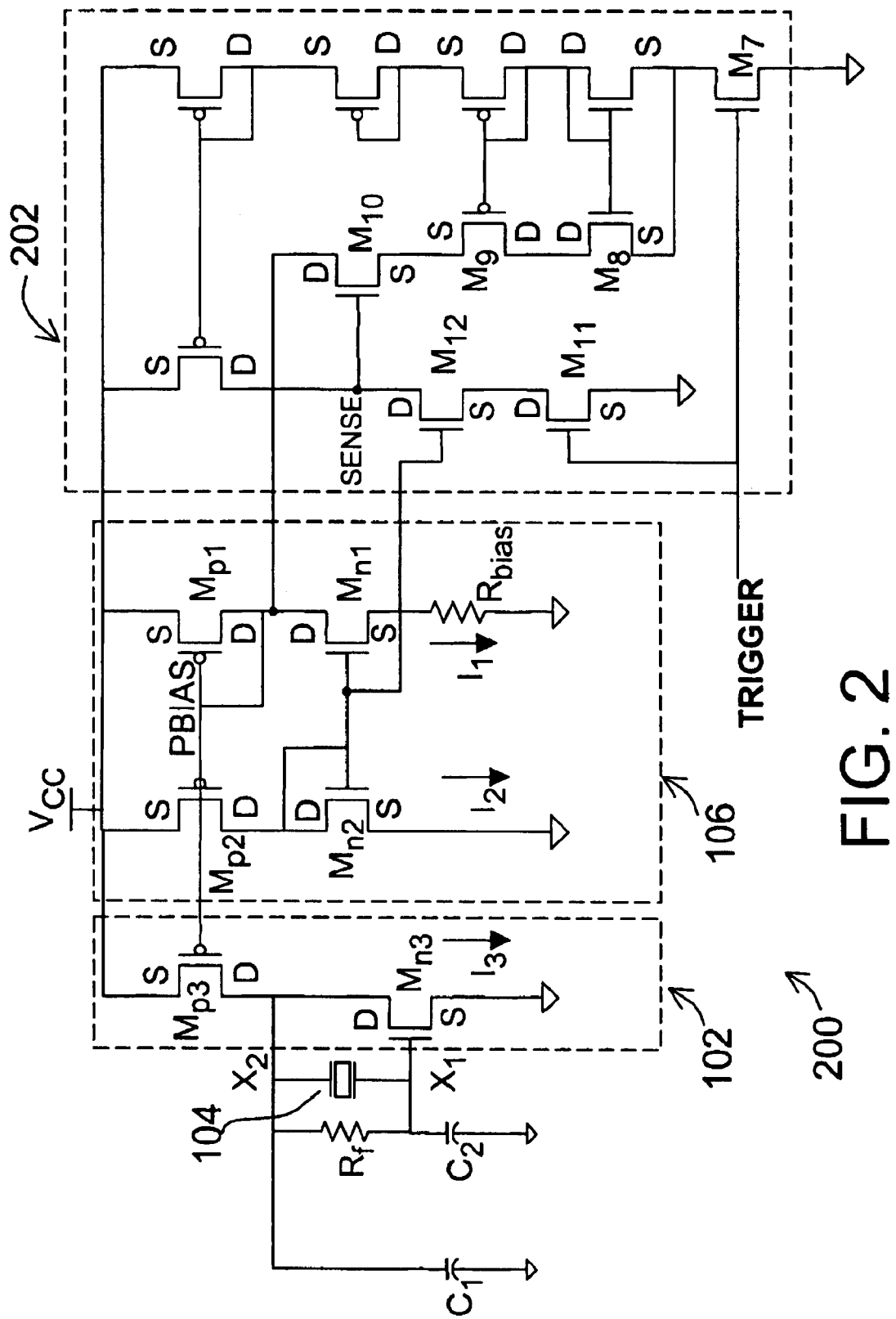
FIG. 2 is a circuit diagram of a clock oscillator circuit with a kick-start circuit and an inhibit circuit.

Referring to FIG. 2, a low power clock oscillator circuit 200 includes a resonator 104, an inverting amplifier 102, a self-bias circuit 106, and a self-timed kicker circuit 202. The kicker circuit 202 "kick-starts" self-bias circuit 106 by providing an excitation to self-bias circuit 106 when power is initially applied, and to inhibit the excitation when inverting amplifier 102 is able to sustain oscillation. The circuit 202 is similar to the circuit described in U.S. Pat. No. 6,191,662 B1, "Self-Start Circuits for Low-Power Clock Oscillators." The inverting amplifier 102, the self-bias circuit 106, and the kicker circuit 202 are all integrated into a single integrated circuit package.

When a logic high TRIGGER signal is applied to the gate node of a transistor $M_7$ transistor $M_7$ is turned on and causes transistors $M_8$, $M_9$, and $M_{10}$ to turn on. This enables a small current to be drawn to ground from node PBIAS through transistors $M_8$ to $M_{10}$. This current is an excitation signal that excites currents in transistors $M_{p1}$, $M_{p2}$, and $M_{p3}$, thereby allowing currents $I_1$ and $I_2$ to start flowing through self-bias circuit 106, and current $I_3$ to start flowing through inverting amplifier 102. Eventually, current $I_3$ grows large enough to be able to sustain oscillation of resonator 104.

The clock oscillator circuit 200 can self-start and sustain oscillation of resonator 104 when there is sufficient current in transistor $M_{p3}$ to overcome any other source of leakage current towards the ground node. This condition will occur when transistor $M_{n2}$ is conducting current above a few nano-amperes (depending on the manufacturing process). Because the current gain between transistors $M_{p3}$ and $M_{p2}$ is designed to be about 3, the current in transistor $M_{p3}$ is about 3 times the current flowing through $M_{p2}$ when resonator 104 starts to oscillate.

In order to inhibit the excitation when inverting amplifier 102 can sustain oscillation of crystal resonator 104, a "current mirror" that includes $M_{11}$ and $M_{12}$ is used to sense the current flowing in transistor $M_{n2}$. Transistor $M_{12}$ is appropriately sized to pull a SENSE node to logic low when current conducting in transistor $M_{n2}$ is sufficient to overcome the leakage current. Transistor $M_{11}$ enables the mirror circuit when the TRIGGER signal is asserted to logic high. When the voltage at the SENSE node is pulled low, the current flowing through transistors $M_8$ to $M_{10}$ is shut off.

The mirror circuit monitors the rise of voltage on the PBIAS node after power is applied and the TRIGGER signal is asserted. The current flowing through $M_8$ to $M_{10}$ is shut off as soon as transistor $M_{n2}$ is conducting sufficient current to sustain oscillation. After the voltage on the SENSE node transitions to logic low, the presence or removal of the TRIGGER signal has no further effect on the self-bias circuit 106 and inverting amplifier 102. Further, if resonator 104 is already oscillating and inverting amplifier 102 is already functioning when the TRIGGER signal is applied, the voltage on the SENSE node will already be low and remain low. Thus, the kicker circuit 202 will not affect self-bias circuit 106 regardless of the logic state of the TRIGGER signal.

Figure 3:
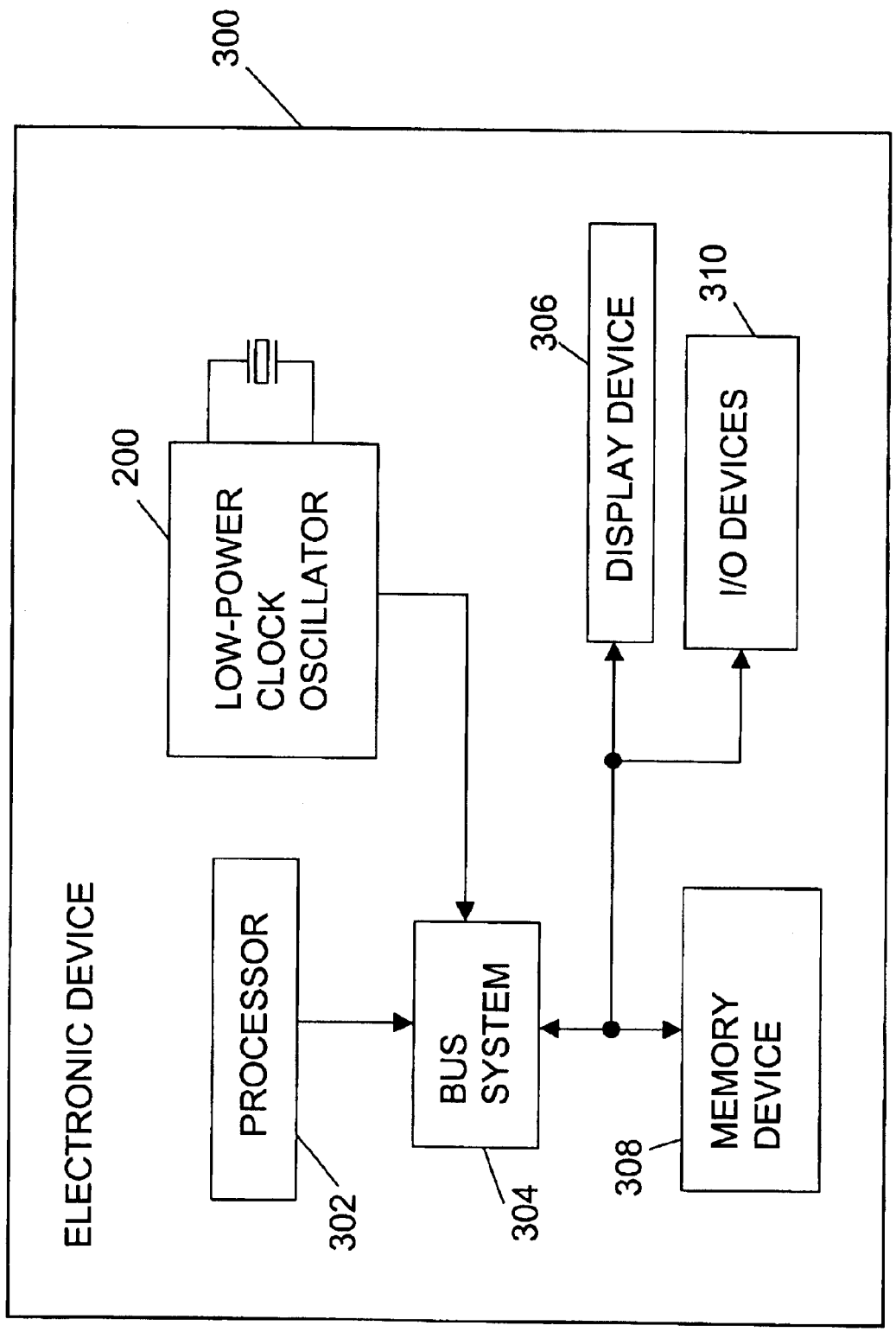
FIG. 3 is a block diagram of an electronic device having a clock oscillator circuit.

Referring to FIG. 3, an electronic device 300 includes a low-power clock oscillator circuit 200 that provides a stable clock signal. Clock oscillator circuit 200 has a self-bias circuit to bias the clock oscillator circuit 200 into a low-power state. The circuit 200 includes circuitry to provide kick-start function during power-up, and circuitry to inhibit kick-start when oscillation is sustained or if the oscillator is already running. The electronic device 300 further includes a processor 302, a bus system 304, a display device 306, a memory device 308, and input/output (I/O) devices 310. The low-power clock oscillator circuit 200 keeps time during periods when the rest of the system is powered down or powered off.

A number of embodiments of the invention have been described. Nevertheless, it will be understood that various modifications may be made without departing from the spirit and scope of the invention. For example, the self-bias circuit may be any type of constant biasing circuitry that can provide an appropriate DC bias voltage at the bias node, as long as the circuitry allows the characteristics (e.g., trip point, gain, current) to scale similarly for the inverting amplifier, the self-bias circuit, and converter across a range of process, voltage, and temperature conditions. The channel types for the transistors shown in FIGS. 1 and 2 may be different, and the N-type and P-type transistors may be interchanged without affecting the functionality of the circuit. Electronic device 300 may be a computer, a handheld device, or any other device that needs to keep a system clock signal while the main power is turned off.

The sizes of transistors $M_{p1}$, $M_{p2}$, $M_{n1}$, $M_{n2}$ can be selected so that currents $I_1$ and $I_2$ are different. For example, if the size of $M_{p1}$ and $M_{n2}$ are selected as W/L, the size of $M_{n1}$ selected as M*W/L, and the size of $M_{p2}$ selected as K*W/L, then $I_1=(V_T/R)*\ln(M*K)$, and $I_2=K*I_1$, where $V_T$ is the thermal voltage (approximately 26 mV at room temperature), and R is the resistance value of resistor $R_{bias}$. Accordingly, other embodiments are within the scope of the following claims.

What is claimed is:

1. Apparatus for generating a clock signal comprising:
an oscillator circuit having an inverting amplifier and a resonator to generate an oscillating signal; and
a bias circuit having a relatively constant current source to create a relatively constant bias voltage to bias the inverting amplifier in an operating state that can sustain the oscillating signal, the current source and the inverting amplifier not forming a feedback loop.

2. The apparatus of claim 1 wherein the inverting amplifier has an input terminal and an output terminal coupled to a first terminal and a second terminal of the resonator, respectively.

3. The apparatus of claim 1 wherein the inverting amplifier comprises a plurality of MOSFETs that operate in the sub-threshold region when the inverting amplifier and the relatively constant current source reach an operation state capable of sustaining oscillation of the oscillator circuit.

4. The apparatus of claim 1 wherein the bias circuit comprises a plurality of MOSFETs that operate in the sub-threshold region when the inverting amplifier and the bias circuit reach an operation state capable of sustaining the oscillation of the oscillator circuit.

5. The apparatus of claim 1, wherein the relatively constant current source has a first leg and a second leg, the first leg to receive a first current flowing therethrough, the second leg to receive a second current flowing therethrough, the first current being in a substantially fixed ratio to the second current, the first leg providing the bias voltage on a node electrically connected to a node of the inverting amplifier, the bias voltage being in a predefined relationship with the current flowing through the first leg.

6. The apparatus of claim 5 wherein the second leg has a component for providing a negative feedback in response to a change in the amount of current flowing through the second leg.

7. The apparatus of claim 1 wherein the bias circuit includes a bias node, and the relatively constant current source is configured to create the bias voltage at the bias node.

8. The apparatus of claim 7 wherein the bias circuit is disposed within an integrated circuit package and connected to the amplifier only through the bias node.

9. The apparatus of claim 8 wherein the bias circuit and the amplifier are disposed within the same integrated circuit package.

10. The apparatus of claim 1, further comprising an excitation circuit to provide an excitation to enable the bias circuit to start operation and to provide a stable bias voltage.

11. The apparatus of claim 10, further comprising an inhibit circuit to inhibit the excitation when the bias circuit is capable of sustaining the bias voltage at a predetermined level.

12. The apparatus of claim 1 wherein the relatively constant current source comprises a first PMOS transistor, a second PMOS transistor, a first NMOS transistor, a second NMOS transistor, and a resistor having a first end and a second end, each of the transistors having a gate node, a source node, and a drain node, the drain node of the first PMOS transistor being coupled to the drain node of the first NMOS transistor, the drain node of the second PMOS transistor being coupled to the drain node of the second NMOS transistor, the gate nodes of the first and second PMOS transistors being coupled to the drain node of the first NMOS transistor and to the inverting amplifier, the gate nodes of the first and second NMOS transistors being coupled to the drain node of the second NMOS transistor, the source node of the first NMOS transistor being coupled to the first end of the resistor, and the relatively constant bias voltage being created at the gate nodes of the first and second PMOS transistors.

13. A real time clock oscillator circuit comprising:
an amplifier having an input to receive an oscillating signal and an output to generate an amplified oscillating signal, a portion of the amplified oscillating signal being fed back to the input of the amplifier; and
a relatively constant current source having a bias node with a bias voltage that biases the amplifier in an operating state capable of sustained amplification of the oscillating signal, the current source and the amplifier not forming a feedback loop.

14. The real time clock oscillator circuit of claim 13 wherein the relatively constant current source generates the bias voltage at a level that biases the amplifier to operate at sub-threshold level.

15. The real time clock oscillator circuit of claim 14 wherein the relatively constant current source also operates at sub-threshold level.

16. The real time clock oscillator circuit of claim 15 wherein the bias voltage is a direct current voltage that is relatively stable relative to a direct current power supply voltage.

17. The real time clock oscillator of claim 13 wherein the relatively constant current source comprises a first PMOS transistor, a second PMOS transistor, a first NMOS transistor, a second NMOS transistor, and a resistor having a first end and a second end, each of the transistors having a gate node, a source node, and a drain node, the drain node of the first PMOS transistor being coupled to the drain node of the first NMOS transistor, the drain node of the second PMOS transistor being coupled to the drain node of the second NMOS transistor, the gate nodes of the first and second PMOS transistors being coupled to the drain node of the first NMOS transistor and to the bias node, the gate nodes of the first and second NMOS transistors being coupled to the drain node of the second NMOS transistor, and the source node of the first NMOS transistor being coupled to the first end of the resistor.

18. Apparatus comprising:
a processor;
a memory to store data;
a chipset to manage data transfers between the memory and the processor; and
a clock oscillator circuit to provide time signals during periods when the rest of the apparatus is powered down or powered off, the clock oscillator circuit having an amplifier for amplifying an oscillating signal, and a bias circuit having a relatively constant current source to generate a bias voltage at a bias node to bias the amplifier at an operating state that amplifies and sustains the oscillating signal at a low power state, the bias circuit and the amplifier not forming a feedback loot.

19. The apparatus of claim 18, further comprising a circuit to provide an excitation to the bias circuit, the excitation enabling the bias circuit to provide a stable bias voltage.

20. The apparatus of claim 18 wherein the clock oscillator circuit includes a plurality of MOSFETs operating in sub-threshold regions.

21. The apparatus of claim 18 wherein the bias circuit is disposed within an integrated package and is coupled to the amplifier only through the bias node.

22. The apparatus of claim 18 wherein the relatively constant current source comprises a first PMOS transistor, a second PMOS transistor, a first NMOS transistor, a second NMOS transistor, and a resistor having a first end and a second end, each of the transistors having a gate node, a source node, and a drain node, the drain node of the first PMOS transistor being coupled to the drain node of the first NMOS transistor, the drain node of the second PMOS transistor being coupled to the drain node of the second NMOS transistor, the gate nodes of the first and second PMOS transistors being coupled to the drain node of the first NMOS transistor and to the bias node, the gate nodes of the first and second NMOS transistors being coupled to the drain node of the second NMOS transistor, and the source node of the first NMOS transistor being coupled to the first end of the resistor.

23. The apparatus of claim 1 in which the inverting amplifier comprises a first P-type transistor and a first N-type transistor and the bias circuit comprises a second P-type transistor and a second N-type transistor, the first P-type transistor having a drain node that is connected to a drain node of the first N-type transistor, the second P-type transistor having a drain node that is connected to a drain node of the second N-type transistor, the first P-type transistor having a gate node that is connected to a gate node of the second P-type transistor, the first P-type transistor and the first N-type transistor having first size ratio, the second P-type transistor and the second N-type transistor having a second size ratio, the first and second size ratios being selected so that the first N-type transistor has a gate-to-source voltage that is slightly higher than a gate-to-source voltage of the second N-type transistor.

24. The apparatus of claim 23 in which the first and second size ratios are selected so that the gate-to-source voltage of the first N-type transistor is higher than the gate-to-source voltage of the second N-type transistor by an amount sufficient to provide a loop gain that can sustain an oscillation of the oscillator circuit when there are manufacturing tolerances in manufacturing the transistors.

25. The apparatus of claim 1 in which the inverting amplifier comprises a first P-type transistor and a first N-type transistor and the bias circuit comprises a second P-type transistor and a second N-type transistor, the first P-type transistor having a drain node that is connected to a drain node of the first N-type transistor, the second P-type transistor having a drain node that is connected to a drain node of the second N-type transistor, the first N-type transistor having a gate node that is connected to a gate node of the second N-type transistor, the sizes of the transistors being selected so that the first P-type transistor has a gate-to-source voltage that is similar to and slightly higher than a gate-to-source voltage of the second P-type transistor.

26. The apparatus of claim 25 in which the first and second size ratios are selected so that the gate-to-source voltage of the first P-type transistor is higher than the gate-to-source voltage of the second P-type transistor by an amount sufficient to provide a loop gain that can sustain an oscillation of the oscillator circuit when there are manufacturing tolerances in manufacturing the transistors.

\* \* \* \* \*